United States Patent [19]

Maxon, Jr. et al.

[11] 3,980,975

[45] Sept. 14, 1976

[54] BROADBAND MICROWAVE BIAS NETWORK

[75] Inventors: Thomas Gerald Maxon, Jr., Georgetown; James Francis Reynolds, Beverly, both of Mass.

[73] Assignee: Varian Associates, Palo Alto, Calif.

[22] Filed: Sept. 8, 1975

[21] Appl. No.: 611,584

[52] U.S. Cl. .............................. 333/70 S; 333/73 R; 333/97 R

[51] Int. Cl.[2] .............................. H03H 7/04

[58] Field of Search ................ 333/73 R, 7 D, 97 R, 333/70 R, 70 S, 24 R, 24 C, 84 R, 84 M; 336/180, 220, 225; 332/52, 56; 267/168

[56] References Cited

UNITED STATES PATENTS

| | | | |
|---|---|---|---|
| 3,090,016 | 5/1963 | Mayer | 333/73 R X |
| 3,521,202 | 7/1970 | Russell | 333/97 R |
| 3,812,438 | 5/1974 | Hopfer | 333/97 R |

FOREIGN PATENTS OR APPLICATIONS

| | | | |
|---|---|---|---|
| 777,071 | 11/1934 | France | 267/168 |

*Primary Examiner*—Paul L. Gensler
*Attorney, Agent, or Firm*—Stanley Z. Cole; Robert K. Stoddard

[57] ABSTRACT

For supplying a bias (modulation) signal, either AC or DC, to a microwave circuit, a network consisting of a low pass filter is provided which presents a high isolating impedance to an extremely wide bandwidth of microwave frequencies, while allowing low frequency bias or modulating signals to be supplied to the microwave circuit without significant attenuation. The network consists of two helical inductors, one within the other, plus a bypass capacitor. The inner small inductor presents a high, non-resonant impedance to high microwave frequencies and the outer, larger inductor presents a high impedance to lower microwave frequencies. The bypass capacitor cooperates with the outer inductor to complete the filter circuit for the lower microwave frequencies. The smaller inductor's proximity to and within the larger inductor provides a distributed shunt capacitance to ground so as to terminate the filter for the higher microwave frequencies at the smaller inductor.

10 Claims, 4 Drawing Figures

FIG. 1
BIAS NETWORK
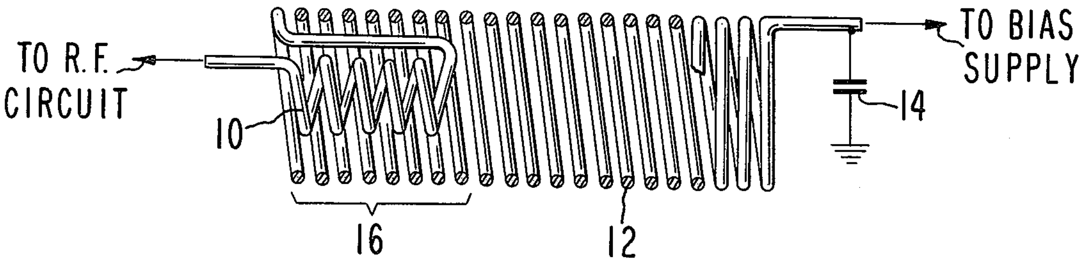
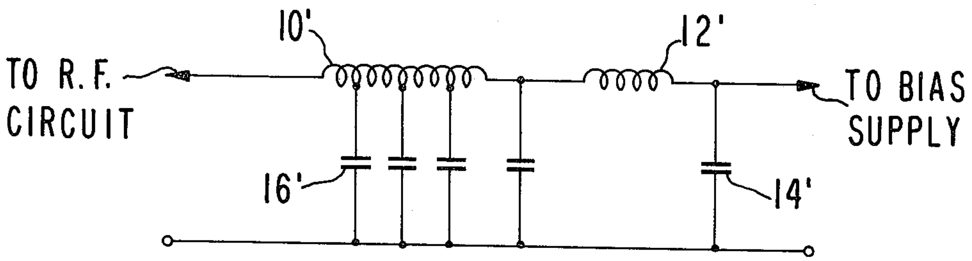
FIG. 2
EQUIVALENT CIRCUIT OF FIG. 1
FIG. 3
BIAS NETWORK WITH
STRIPLINE CIRCUIT
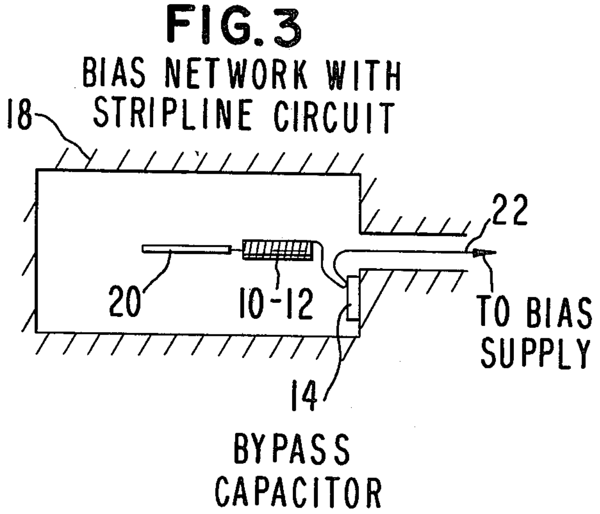
FIG. 4
WITH MICROSTRIP
CIRCUIT
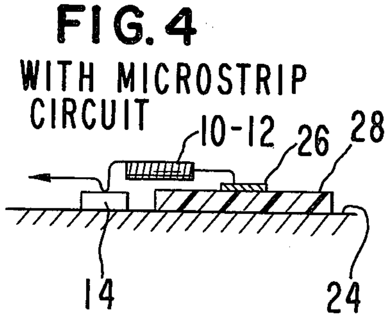

BROADBAND MICROWAVE BIAS NETWORK

FIELD OF THE INVENTION

This invention relates to a network for supplying bias in the form of a modulation signal to a microwave circuit without transmission of the microwave signal, and particularly to such a circuit which is able to block microwave signal transmission over a very wide frequency band.

BACKGROUND OF THE INVENTION

It is frequently necessary to supply a modulation signal to a microwave circuit, either to modulate the microwave signal traveling on the microwave circuit with another, lower frequency signal, or to turn on or turn off the transmission of microwave energy in the microwave circuit.

The source of modulation or bias signal cannot be connected directly to the microwave circuit (termed a transmission line) by conventional isolating elements such as a diode because a diode does not provide isolation between the transmission line and the bias source at microwave frequencies. It is conventional to use an inductor or an inductor together with a capacitor, the combination constituting a low pass filter (LPF) which transmits the lower frequency bias signals, but isolates the microwave signals from the bias source.

While an LPF is able to provide a high impedance to microwave signals and a low impedance to the bias signal, it has a limited operating bandwidth and thus cannot provide isolation over a broad range of microwave frequencies.

Specifically, although the LPF will operate satisfactorily at a range of frequencies from its cutoff frequency to a frequency somewhat above cutoff, for frequencies appreciably above cutoff the inductor or inductors in the LPF will be self-resonant, thereby effectively destroying the isolating properties of the filter at these frequencies.

Accordingly, one object of the present invention is to provide a microwave bias network which is operable effectively over a very wide bandwidth, i.e. provides isolation to a very broad range of microwave frequencies. Other objects are to provide a microwave bias network which is simple in construction, economical, and highly reliable. Further objects and advantages will become apparent from a consideration of the ensuing description.

BRIEF DESCRIPTION OF THE DRAWING

FIG. 1 is a diagram, partially in schematic form, of a microwave bias network in accordance with the invention.

FIG. 2 is a schematic of a equivalent circuit for the network of FIG. 1.

FIG. 3 shows the bias network connected in a stripline circuit.

FIG. 4 shows the bias network connected to a microstrip circuit.

FIG. 1 - DESCRIPTION OF INVENTION

The bias network of the invention, shown in FIG. 1, consists of two coils or helical inductors comprising an inner, smaller inductor 10 and an outer larger inductor 12 which is shown in cutaway form to show inductor 10 clearly. Inductors 10 and 12 are connected in series and inductor 10 has a smaller axial length than inductor 12 and is positioned inside inductor 12 One end of inductor 10 is designed to be connected to a microwave transmission line or radio frequency (RF) circuit. The other end of inductor 10 is connected to one end of inductor 12 and the other end of inductor 12 is connected to a bias supply (not shown). The other end of inductor 12 is bypassed to ground through a conventional bypass capacitor 14.

In one embodiment of the invention, wherein isolation was effectively provided over an extremely broad range of frequencies, 0.1 to 18 GHz, smaller inductor 10 consisted of five to seven turns of a 1 mil (25 micron) diameter wire formed on approximately a 10 mil (250 micron) diameter form. Outer inductor 12 consisted of a thirty turn coil of the same wire as coil 10 formed on approximately a 15 mil (380 micron) diameter form. The first coil was formed on a section of wire sufficiently distant from the second coil such that the wire connecting the coils was long enough to be bent twice as illustrated to allow the inner coil to be positioned entirely within the outer coil.

By virtue of the fact that coil 10 is positioned within coil 12, a distributed capacitance which is significant at higher microwave frequencies exists between coils 10 and 12 in the region of coil 10 as indicated at 16. Capacitor 14 had a value of at least 100 pF.

FIG. 2 - EQUIVALENT CIRCUIT

An approximate equivalent circuit of the bias network of FIG. 1 is illustrated in FIG. 2 with equivalent elements being indicated by like, but primed reference numerals. The equivalent circuit consists of a relatively small-valued inductor 10' which is fulfilled by inductor 10 of FIG. 1. For high microwave frequencies, e.g., 8 to 10 GHz to 18 GHz, the distributed capacitance between inductors 10 and 12 is represented by capacitors 16'. The ends of these capacitors distal from inductor 10 are actually in effect connected to inductor 12, but are shown connected to ground in FIG. 2 since, for high microwave frequencies inductor 12 presents a very low impedance.

Inductor 12 is represented in FIG. 2 by inductor 12' and bypass capacitor 14 is represented at 14'.

OPERATION OF NETWORK

In operation, the network presents a very high impedance to an extremely broad band of microwave signals, e.g. a bandwidth in excess of 100 to 1. At the upper end of the band, smaller inductor 10 presents a high impedance. Because of its small size and small number of turns, it does not have self resonant frequencies in this range.

Larger inductor 12 provides sufficient inductance to provide a high impedance to lower frequencies, e.g., as low as 100 MHz. It acts in association with capacitor 14 to provide a LPF structure at these frequencies.

Because the smaller coil 10 is enclosed within larger coil 12, a shunt capacitance to ground is effectively provided for the high frequencies, e.g., 8 to 18 GHz, thereby to terminate the first part of the filter structure.

FIG. 3 - BIAS NETWORK WITH STRIPLINE CIRCUIT

FIGS. 3 and 4 show examples of how the bias network of the invention can be connected to microwave transmission lines. FIG. 3 shows a typical strip line transmission line consisting of an outer surrounding conductor 18 and an inner or center conductor 20. As is well known, microwave energy propagates along the strip line 18–20 in a direction perpendicular to the direction of the paper. A bias network in accordance with the invention, consisting of inner and outer coils 10-12 and bypass capacitor 14 is connected to center conductor 20, with inner coil 10 (not illustrated in FIG. 3) connected to conductor 20 and outer coil 12 connected to capacitor 14 and thence to a bias supply source (not shown). Bypass capacitor 14 is constituted by a conventional "chip" capacitor affixed to surrounding conductor 18.

In operation, microwave energy anywhere within the range of from .1 to 18 GHz travels down strip line 18–20. Such energy can be modulated at frequencies below 0.1 GHz or switched on and off by supplying an appropriate signal to the bias network via lead 22. Lead 22 may be connected to an oscillator, e.g., voltage controlled oscillator (VCO), a mixer, a detector (including a PIN diode attenuator), a switch (e.g. a PIN diode switch) etc. to either switch off or otherwise modulate the microwave energy on line 18–20 in any desired fashion for radar, communications (including CW), ECM, or other applications.

FIG. 4 - MICROSTRIP CIRCUIT

FIG. 4 illustrates the use of the bias network of the invention with a microstrip circuit comprising a base conductor 24 and a top conductor 26 separated by an insulating layer 28. Microwave energy is designed to propagate along conductors 24–26 in a direction perpendicular to the paper. A bias network 10–12 in accordance with the invention is connected to top conductor 26 and to capacitor 14 and the bias supply (not shown) in conventional fashion. Bypass capacitor 14 is connected mounted on base conductor 24.

RESULTS

A bias network in accordance with the invention and constructed as aforedescribed has been operated successfully over the frequency range of 0.1 to 18 GHz with Varian VSZ9721 PIN diode attenuator/switches. The introduction of this bias network introduced no noticeable (less than 0.1 db) insertion loss over this frequency range while providing greater than 30 db (typically 40 db) isolation between the RF signal and the bias source over this range. The network did not present any self-resonances to the *rf* signals anywhere within this range.

While the above description contains many specificities, these should not be construed as limitations upon the scope of the invention, but as exemplifications of several preferred embodiments thereof. The true scope of the invention is indicated by the appended claims and their legal equivalents.

What is claimed is:

1. A broadband microwave bias network comprising a relatively large helical inductor, a relatively small helical inductor positioned within said large inductor so as to create a distributed capacitance between said inductors, and means connecting said inductors in series, said distributed capacitance and inductors forming a filter network for applying low frequency signals to a microwave circuit.

2. The network of claim 1 wherein said small inductor has an axial length less than that of said large inductor and is positioned adjacent one end of said large inductor.

3. The network of claim 1 further including a bypass capacitor connected to one end of said large inductor.

4. The network of claim 1 further including a two-conductor microwave transmission line, one end of said small inductor being connected to one conductor of said transmission line.

5. The invention of claim 4 wherein said microwave transmission line is a stripline comprising an elongated surrounding conductor and a center conductor, one end of said network being connected to said center conductor, the other end thereof being connected to a bias supply.

6. The invention of claim 5 further including a bypass capacitor connected between said other end of said network and said elongated surounding conductor.

7. The invention of claim 1 wherein said large and small inductors are formed of a single length of wire at spaced locations thereon.

8. The invention of claim 7 wherein the wire extending from one end of said small inductor is bent back toward the other end of said small inductor and is connected to said large inductor adjacent said other end.

9. The invention of claim 4 wherein said microwave transmission line is a microstrip comprising a base conductor and a top conductor spaced from and parallel to said base conductor, one end of said network being connected to said top conductor, the other end thereof being connected to a bias supply.

10. The invention of claim 9 further including a bypass capacitor connected between said other end of said network and said base conductor.

* * * * *